United States Patent
Lee

(10) Patent No.: US 7,211,945 B2
(45) Date of Patent: May 1, 2007

(54) ORGANIC ELECTROLUMINESCENT DISPLAY DEVICE WITH IMPROVED IMAGE CLARITY AND LIGHT EMITTING EFFICIENCY

(75) Inventor: Ki Dong Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/876,612

(22) Filed: Jun. 28, 2004

(65) Prior Publication Data

US 2004/0263070 A1    Dec. 30, 2004

(30) Foreign Application Priority Data

Jun. 30, 2003    (KR) .................... 10-2003-0043639

(51) Int. Cl.
*H01J 1/62*   (2006.01)
*H01J 63/04*   (2006.01)

(52) U.S. Cl. .................... 313/504; 313/506; 313/505

(58) Field of Classification Search ................ 313/501, 313/504, 505, 506
See application file for complete search history.

(56) References Cited

U.S. PATENT DOCUMENTS

| | | | |
|---|---|---|---|
| 4,528,260 A * | 7/1985 | Kane | 430/321 |
| 6,259,423 B1 * | 7/2001 | Tokito et al. | 313/506 |
| 6,443,579 B1 | 9/2002 | Myers | 359/613 |
| 6,476,550 B1 * | 11/2002 | Oda et al. | 313/504 |
| 6,900,457 B2 * | 5/2005 | Toguchi et al. | 257/40 |
| 6,984,934 B2 * | 1/2006 | Moller et al. | 313/506 |
| 2002/0118271 A1 * | 8/2002 | Mashimo et al. | 347/241 |
| 2003/0006980 A1 * | 1/2003 | Brabander et al. | 345/207 |
| 2004/0056592 A1 * | 3/2004 | Noguchi | 313/512 |

FOREIGN PATENT DOCUMENTS

KR    2003-0026450    4/2003

OTHER PUBLICATIONS

Korean Office Action (Jul. 12, 2005).

* cited by examiner

*Primary Examiner*—Nimeshkumar D. Patel
*Assistant Examiner*—Natalie K. Walford
(74) *Attorney, Agent, or Firm*—Ked & Associates, LLP

(57) ABSTRACT

An organic electroluminescent (EL) display device is provided which includes a film with a multi-dimensional grating pattern formed on a surface thereof. The display device includes a transparent substrate, a first electrode formed on the transparent substrate, an organic light emitting layer formed on the first electrode, a second electrode formed on the organic light emitting layer. The is provided at a bottom of the transparent substrate. A display device employing this film with a multi-dimensional grating pattern provides improved light emitting efficiency and enhanced image quality.

7 Claims, 3 Drawing Sheets

ORGANIC ELECTROLUMINESCENT DISPLAY DEVICE WITH IMPROVED IMAGE CLARITY AND LIGHT EMITTING EFFICIENCY

CROSS-REFERENCE TO RELATED APPLICATIONS

This application claims the benefit of Korean Application No. P2003-43639, filed on Jun. 30, 2003, which is hereby incorporated by reference as if fully set forth herein.

BACKGROUND OF THE INVENTION

1. Field of the Invention

The present invention relates to an organic electroluminescent display.

2. Discussion of the Related Art

Many concerns are focused on an organic EL (electroluminescent) display as a flat display for next generation. The EL display is provided to a small mobile apparatus such as a mobile phone and is in common use.

The organic EL display employed to the mobile apparatus requires long life span and low electric consumption. However, the organic EL display currently used is not satisfied with the condition.

One of the reasons why the organic EL display does not have long life span and low electric consumption is a use of a substrate having a high refractive index.

Namely, most of light generated by using the substrate having the high refractive index is totally reflected because a part of the light is emitted.

In general, total inner reflection of a glass substrate and a loss of light from doparo effect reach about 80%. Therefore, brightness of the display is increased with a little electric consumption if the loss of light is reduced.

Not only time of using the mobile apparatus is elongated but also the life span of the organic EL display is elongated because brightness of the display is increased with a little electric consumption.

Therefore, a method of roughening a surface of the substrate, a method of forming a pattern with projections on the surface of the substrate, and a method of using semicircular lens in a millimeter size are employed as a method for reducing a light loss resulted from the inner reflection and doparo effect, and increasing the light efficiency.

However, the methods have problems that a pattern of light radiation is changed, a displayed image is blurred, and manufacturing is difficult.

SUMMARY OF THE INVENTION

Accordingly, the present invention is directed to an EL (electroluminescent) display that substantially obviates one or more problems due to limitations and disadvantages of the related art.

An object of the present invention is to provide an EL display having an improved light emitting efficiency and displaying a clear image.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an EL display includes a first electrode formed on the transparent substrate, an organic light emitting payer formed on the first electrode, a second electrode formed on the organic light emitting layer, and a film formed at a bottom of the transparent substrate and having a two-dimensional pattern on a surface thereof.

In this case, the cycle of the two-dimensional grating pattern is less than 200 nm and includes a plurality of projections.

Each of the plurality of projections may be hexahedral and is arrayed in a matrix form at a same interval.

The film is a macromolecular material being capable of intensifying heat or ultraviolet rays and having 85% of transmissivity.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The purpose of the present invention is manufacturing an organic EL (electroluminescent) display by using a film with a two-dimensional grating pattern for increasing luminescent efficiency of the display.

Figure 1:
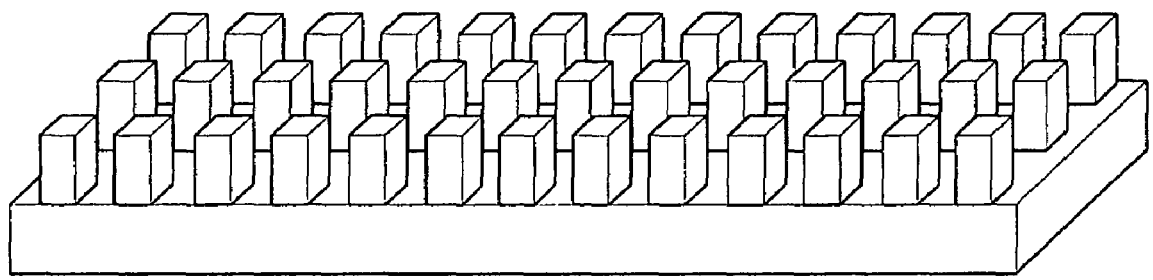
FIG. 1 illustrates a diagram showing a film having a two-dimensional grating pattern attached to an organic EL display in accordance with the present invention.

FIG. 1 illustrates a diagram showing the film having a two-dimensional grating pattern attached to the organic EL display in accordance with the present invention. The two-dimensional grating pattern is formed on a surface of the film employed by the present invention.

The two-dimensional grating pattern is that materials having a different refractive index are arrayed at a predetermined interval in two dimensions. In this case, one interval of the grating pattern is in a smaller size than a half wavelength of light. When a wavelength of a blue color is about 400 nm, one interval of the grating pattern is about 200 nm.

The two-dimensional grating pattern with a smaller interval than the half wavelength of light does not diffract but penetrate light in 0-dimensional mode. An effective refractive index is lowered decreasing reflection of light so as to increase a luminous efficiency of the display.

As illustrated in FIG. 1, the two-dimensional grating pattern includes a plurality of projections. It is desirable that each of the plurality of projections is formed in a hexahedral form.

Depending on cases, the projection can be polyhedral, globular, and circular form. The projections are arrayed in a matrix form at a same interval.

It is good to employ a material such as a macromolecule being capable of intensifying heat or ultraviolet rays and having 85% of transmissivity for manufacturing the film with the two-dimensional grating pattern.

Figure 2:
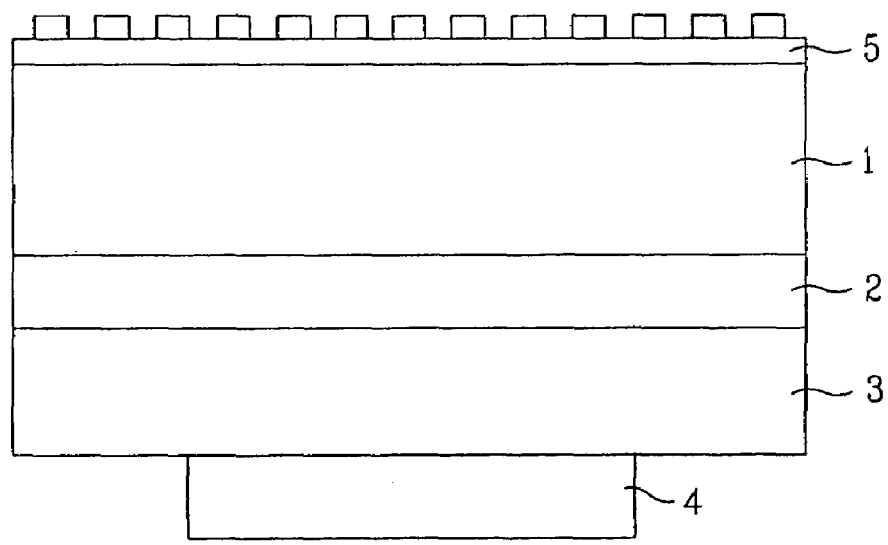
FIG. 2 illustrates a diagram showing an organic EL display in accordance with the present invention.

FIG. 2 illustrates a diagram showing the organic EL display in accordance with the present invention, and a manufacturing process of the organic EL display is as follows.

First, a first electrode 2 is formed on a transparent substrate 1. The first electrode 2 being an anode employs ITO (indium tin oxide). The organic light-emitting layer 3 is formed on the first electrode 2.

In this case, the organic light-emitting layer includes a HIL (hole injecting layer), a light emitting layer, an ETL (electron transport layer), and an EIL (electron injecting layer). One of the layers may be omitted depending on cases.

In general, the HIL is formed in a size of 10–30 nm. The HTL includes about 30–60 nm of N,N'-diphenyl-N,N'-bis (3-methylphenyl)-(1-1'-biphenyl)-4,4'-diamine(TPD) or, 4,4'-bis[N-(1-naphthyl)-N-phenyl-amino]bipheny(NPD).

Dopant is added to the light-emitting layer at need. About 30–60 nm of Alq3 (tris(8-hydroxy-quinolate)aluminum) is formed on a green light-emitting layer, and dopant normally employs coumarin 6 or Qd(Quinacridone).

Subsequently, the ETL may be omitted on a certain occasion. The EIL includes a thin layer of about 5 Å of LiF or $Li_2O$, or under about 200 Å of alkali metal or alkalito metal such as Li, Ca, Mg, and Sr.

A second electrode 4 is formed on the organic light emitting layer 3 formed as abovementioned. The second electrode 4 being a cathode employs a high conductive metal.

A film 5 having a two-dimensional grating pattern at a lower part of the glass substrate 1. If there is not the film 5 having a grating pattern at the lower part of the glass substrate 1, a part of light generated from the organic light emitting layer 3 passes through the glass substrate 1 reflecting all lights from an interface between the glass substrate 1 and air.

Total reflection of light is determined by an angle of light entering into the glass substrate 1, and again by refractive index of the glass 1.

Amount of total reflection is increased by a large index of refraction. Therefore, if a film of smaller material than the refractive index of the glass on the glass substrate 1 is attached to, the amount of total reflection of light is decreased.

When the two-dimensional grating pattern with a smaller interval than the reflective light wavelength is formed on a surface of the film 5, a reflective index of the film 5 with the grating pattern becomes smaller than the film with no grating film such that a total reflection amount of light is further decreased.

Furthermore, light is not diffracted but progressed in one dimension because one interval of the grating pattern is smaller than the reflective light wavelength. Accordingly, since there is no distortion on a wave surface, there is no distortion or blur of an image.

FIGS. 3A to 3E illustrate a diagram showing a manufacturing process of a mold for manufacturing a film of FIG. 1. First, not only silicon but also Quartz, GaAs, Ge and nickel produced from electroforming are employed as a material of the mold.

Figure 3A:
FIGS. 3A to 3E illustrate a diagram showing a manufacturing process of a mold for manufacturing a film of FIG. 1.
Figure 3B:
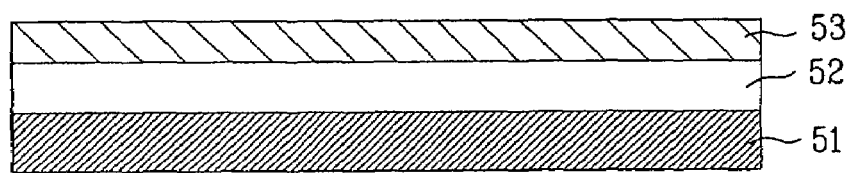

First, as illustrated in FIG. 3A, a nitrifying silicon film 52 is formed on a silicon substrate 51 in a PECVD method. As Illustrated in FIG. 3B, a sensitive emulsion 53 is formed on the nitrifying silicon film 52.

In this case, the sensitive emulsion 53 needs to suit the process of work when an electron beam lithography or x-ray lithography is employed.

Figure 3C:
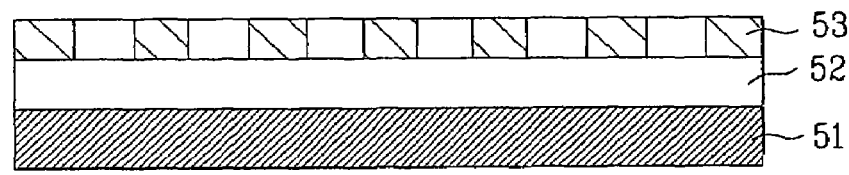

Subsequently, the two-dimensional grating pattern is formed by a method of radiating or developing a light or electron beam to the sensitive emulsion 53 as illustrated in FIG. 3C.

For example, in a case of an optical lithography or x-ray lithography, a mask is employed for forming the grating pattern. The grating pattern is directly formed without using any mask when the electron beam lithography is employed.

In a case of the laser interfering lithography, an interfering pattern employed for forming the grating pattern, the interfering pattern formed in a process of recombining separated laser lights.

Figure 3D:
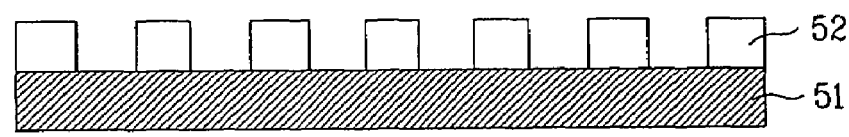

Subsequently, the nitrifying silicon film 52 is etched using the sensitive emulsion 53 as a mask as illustrated in FIG. 3D.

Figure 3E:

As illustrated in FIG. 3E, a part of the silicon substrate 51 is removed by using the nitrifying silicon film 53 as the mask, and the silicon mold is completed removing the rest of nitrifying silicon film 53.

Using the abovementioned manufacturing process of semiconductor, the mold is manufactured using not only the silicon but also other materials such as Quartz.

For improving durability of the mold, the mold may be manufactured by metal. In this case, a famous electroforming is employed.

Figure 4A:
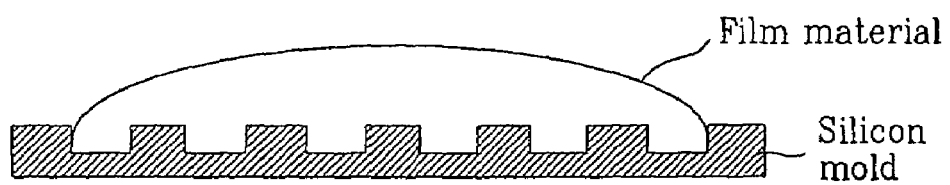
FIGS. 4A to 4C illustrate a diagram showing a film manufacturing process of FIG. 1.
Figure 4B:
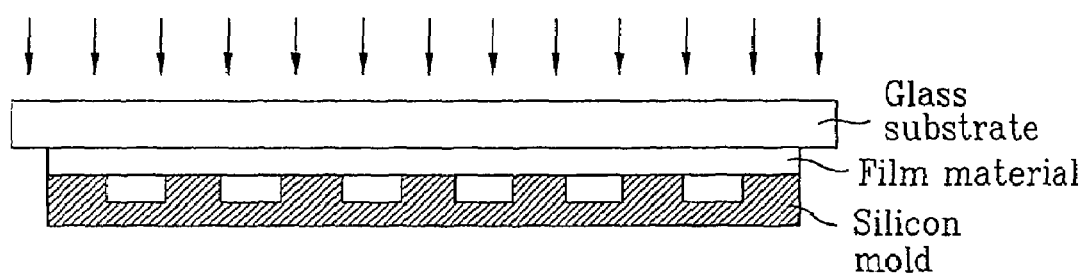
Figure 4C:
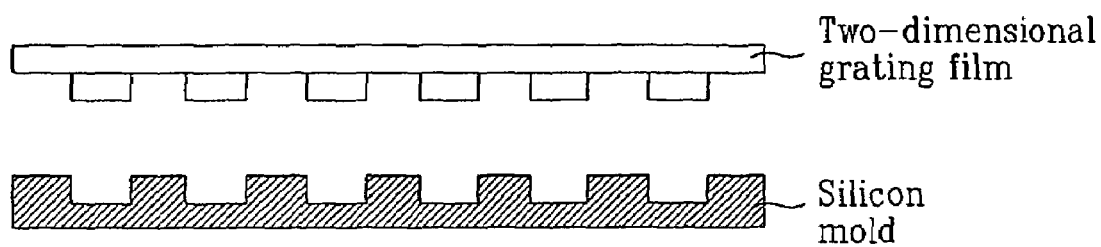

FIGS. 4A to 4C illustrates a diagram showing a film manufacturing process of FIG. 1. As illustrate in FIGS. 4A to 4C, a film material is injected onto the silicon mold illustrated in FIG. 3E.

In this case, the film material is a macromolecule enabling intensifying heat or ultraviolet rays and has 85% of transmissivity.

As illustrated in FIG. 4B, the macromolecular material is placed on top of the film material, pressed by using a hard plate such as the glass substrate, and attached to the silicon mold by heating or radiating.

In this case, the thickness of the film is determined by pressure and a hardening condition. The plate for pressing needs to be parallel to the mold.

The film needs to have high transmissivity.

Lastly, as illustrated in FIG. 4, the film having the two-dimensional grating pattern is completed when the film is separated from the silicon mold.

The film manufactured as abovementioned is attached to a bottom of the glass substrate.

In this case, the grating pattern formed on the film is a reverse pattern of the pattern formed at the silicon mold.

As a method for copying the grating pattern, except the abovementioned methods, there is a method that a thin metal mold is laid on top of the macromolecule film, and the mold is passed through the roller pressing the roller.

As described above, the present invention manufactures the film having the two-dimensional grating pattern using the silicon mold and has effects of increasing the light emitting efficiency of the organic EL display and displaying clear image.

It will be apparent to those skilled in the art that various modifications and variations can be made in the present invention without departing from the spirit or scope of the inventions. Thus, it is intended that the present invention covers the modifications and variations of the invention provided they come within the scope of the appended claims and their equivalents.

What is claimed is:

1. An electroluminescent display device, comprising:
   a transparent substrate;
   a first electrode formed on the transparent substrate;
   a light-emitting layer formed on the first electrode;
   a second electrode formed on the light-emitting layer; and
   a film having a grating pattern, the grating pattern comprising a plurality of grating components formed on a surface thereof, wherein each grating component of the grating pattern extends in the X, Y and Z dimensions, wherein the plurality of grating components comprises a plurality of projections arranged in a matrix form which each extend outward from a base portion of the film, and wherein each interval between adjacent projections of the plurality of projections is less than or equal to approximately half of a corresponding reflective light wavelength.

2. The device of claim 1, wherein each interval between adjacent projections is less than approximately 200 nm.

3. The device of claim 1, wherein the base portion of the film is provided on a bottom surface of the transparent substrate, and the light-emitting layer is provided on a top surface of the transparent substrate.

4. The device of claim 1, wherein each of the plurality of projections is formed in one of a polyhedral, semi-spherical, and circular form.

5. The device of claim 4, wherein each of the plurality of projections comprises a hexahedral form which extends from a base portion of the film.

6. The device of claim 1, wherein the film comprises a macromolecular material configured to intensify heat or ultraviolet rays, and wherein the film has a light transmissivity of greater than approximately 85%.

7. The device of claim 1, the film having with a grating pattern formed on a surface thereof comprises two different materials, each material having a different refractive index.

* * * * *